(12) United States Patent
Zhu et al.

(10) Patent No.: US 9,461,116 B2
(45) Date of Patent: Oct. 4, 2016

(54) METHOD OF FORMATION OF A TI-IGBT

(71) Applicants: INSTITUTE OF MICROELECTRONICS, CHINESE ACADEMY OF SCIENCES, Beijing (CN); SHANGHAI LIANXING ELECTRONICS CO., LTD., Shanghai (CN); JIANGSU CAS-IGBT TECHNOLOGY CO., LTD, Jiangsu (CN)

(72) Inventors: Yangjun Zhu, Beijing (CN); Wenliang Zhang, Beijing (CN); Shuojin Lu, Beijing (CN); Xiaoli Tian, Beijing (CN); Aibin Hu, Beijing (CN)

(73) Assignees: INSTITUTE OF MICROELECTRONICS, CHINESE ACADEMY OF SCIENCES (CN); SHANGHAI LIANXING ELECTRONICS CO., LTD. (CN); JIANGSU CAS IGBT TECHNOLOGY CO., LTD. (CN)

( * ) Notice: Subject to any disclaimer, the term of this patent is extended or adjusted under 35 U.S.C. 154(b) by 0 days.

(21) Appl. No.: 14/649,553

(22) PCT Filed: Dec. 6, 2012

(86) PCT No.: PCT/CN2012/086016
§ 371 (c)(1),
(2) Date: Jun. 4, 2015

(87) PCT Pub. No.: WO2014/086015
PCT Pub. Date: Jun. 12, 2014

(65) Prior Publication Data
US 2015/0349102 A1    Dec. 3, 2015

(51) Int. Cl.
*H01L 29/739*    (2006.01)
*H01L 21/331*    (2006.01)
(Continued)

(52) U.S. Cl.
CPC ..... *H01L 29/0834* (2013.01); *H01L 21/26513* (2013.01); *H01L 21/302* (2013.01);
(Continued)

(58) Field of Classification Search
CPC .......... H01L 29/1095; H01L 29/7395; H01L 29/7397; H01L 29/0834
See application file for complete search history.

(56) References Cited

U.S. PATENT DOCUMENTS

| 5,352,910 A | * | 10/1994 | Muraoka | ............. H01L 29/7392 257/148 |
| 2005/0017290 A1 | * | 1/2005 | Takahashi | ........... H01L 29/0696 257/328 |

(Continued)

FOREIGN PATENT DOCUMENTS

| CN | 101123270 A | 2/2008 |
| CN | 101499422 A | 8/2009 |
| CN | 101887913 A | 11/2010 |

OTHER PUBLICATIONS

International Search Report from PCT/CN2012/086016 (Sep. 12, 2013).

(Continued)

*Primary Examiner* — Victor A Mandala
*Assistant Examiner* — Regan J Rundio
(74) *Attorney, Agent, or Firm* — Goodwin Procter LLP

(57) ABSTRACT

A TI-IGBT, comprising a first semiconductor substrate, a second semiconductor substrate, and a first doped layer; a short circuit region and a collector region disposed in parallel are formed in the first semiconductor substrate; the short circuit region and the collector region have different doping types; the second semiconductor substrate is located on the upper surface of the first semiconductor substrate, and has the same doping type with the short circuit region; the first doped layer is located between the first semiconductor substrate and the second semiconductor substrate, and covers at least the collector region; the first doped layer has the same doping type with the second semiconductor substrate, and has a doping concentration smaller than that of the second semiconductor substrate.

9 Claims, 9 Drawing Sheets

(51) Int. Cl.
  *H01L 21/425* (2006.01)
  *H01L 21/302* (2006.01)
  *H01L 29/08* (2006.01)
  *H01L 29/06* (2006.01)
  *H01L 29/66* (2006.01)
  *H01L 21/265* (2006.01)
  *H01L 29/36* (2006.01)
  *H01L 21/18* (2006.01)

(52) U.S. Cl.
  CPC ....... *H01L29/0615* (2013.01); *H01L 29/0821* (2013.01); *H01L 29/36* (2013.01); *H01L 29/66333* (2013.01); *H01L 29/7395* (2013.01); *H01L 21/185* (2013.01)

(56) References Cited

U.S. PATENT DOCUMENTS

| | | | |
|---|---|---|---|
| 2010/0230716 A1* | 9/2010 | Naijo | H01L 29/7397 257/139 |
| 2010/0301386 A1* | 12/2010 | Lin | H01L 29/0834 257/140 |
| 2011/0180902 A1 | 7/2011 | Inagawa | |
| 2012/0068220 A1* | 3/2012 | Kobayashi | H01L 29/7397 257/124 |

OTHER PUBLICATIONS

Written Opinion from PCT/CN2012/086016 (Sep. 12, 2013).

* cited by examiner

METHOD OF FORMATION OF A TI-IGBT

The present application is a national phase filing of International Application No. PCT/CN2012/086016, filed Dec. 6, 2012, the entirety of which is incorporated herein by reference.

FIELD

The present disclosure relates to the technical field of semiconductor device fabrication, and particularly to a TI-IGBT and a formation method thereof.

BACKGROUND

A Vertical Double diffused Metal-Oxide-Semiconductor Field-Effect Transistor (abbreviated as VDMOS) has a good switching characteristic and a good linear characteristic. The VDMOS is mainly applied to motor speed regulation, an inverter, an uninterruptible power supply, an electronic switch, a high fidelity voice box, an automotive electric appliance, an electronic ballast and the like. As shown in FIG. 1, since an N-type semiconductor is formed on the rear surface of the VDMOS device, the VDMOS device is an unipolar device and the conduction voltage drop of the VDMOS device increases rapidly as the withstand voltage thereof increases.

An Insulated Gate Bipolar Transistor (abbreviated as IGBT) is a combined full-controlled voltage-driven power semiconductor device comprised of a Bipolar Junction Transistor (BJT) and an Insulated Gate Field Effect Transistor (MOSFET). The IGBT has advantages of high input impedance of the MOSFET device and low conduction voltage drop of a power transistor (i.e., a giant transistor, abbreviated as GTR) and is widely used as a high-voltage switch. As shown in FIG. 2, since a P-type semiconductor is formed on the rear surface of the IGBT device, a large number of holes are injected into the P-type collector region of the IGBT device when the IGBT device is turned on, a conductivity modulation effect occurs and the conduction voltage drop of the IGBT device is reduced, and thus the excess minority carriers are required to be recombined when the IGBT device is turned off, resulting in a low turn-off speed of the IGBT device.

A Fast Recovery Diode (abbreviated as FRD) is a semiconductor diode with a good switching characteristic and a short reverse recovery time. The FRD is mainly used as a high frequency rectifier diode, a freewheeling diode or a damping diode in an electronic circuit such as a switch power supply, a Pulse Width Modulator (PWM) and a frequency changer.

Therefore, a Triple mode Integrate Insulated Gate Bipolar Transistor (abbreviated as TI-IGBT) is developed in which structures and functions of the IGBT device, the VDMOS device and the FRD device are neatly combined together. The TI-IGBT device has small conduction voltage drop in the case that the TI-IGBT device is forward turned on, similarly to IGBT; the TI-IGBT device has a fast turn-off speed in the case that the TI-IGBT device is turned off, similarly to VDMOS; and it is not necessary to connect a fast recover diode in anti-parallel in the case that a reverse voltage is applied on the TI-IGBT device, similarly to FRD. However, there is a current snap-back phenomenon during the operation of the TI-IGBT device.

SUMMARY

In order to solve the above technical problem, a TI-IGBT is provided according to an embodiment of the present disclosure, to solve the current snap-back phenomenon during the operation of the TI-IGBT in the conventional technology.

In order to solve the above technical problem, technical solutions as follows are provided according to embodiments of the present disclosure.

A TI-IGBT includes: a first semiconductor substrate, where a short-circuit region and a collector region disposed in parallel are formed in the first semiconductor substrate, and a doping type of the short-circuit region is different from a doping type of the collector region; a second semiconductor substrate, where the second semiconductor substrate is located above an upper surface of the first semiconductor substrate, and a doping type of the second semiconductor substrate is the same as the doping type of the short-circuit region; and a first doped layer, where the first doped layer is located between the first semiconductor substrate and the second semiconductor substrate, and the first doped layer covers at least the collector region in the first semiconductor substrate, where a doping type of the first doped layer is the same as the doping type of the second semiconductor substrate, and a doping concentration of the first doped layer is lower than a doping concentration of the second semiconductor substrate.

Preferably, the first semiconductor substrate is covered completely by the first doped layer.

Preferably, only the collector region is covered by the first doped layer.

Preferably, the TI-IGBT further includes a second doped layer, where the second doped layer is located between the short-circuit region and the second semiconductor substrate, and a doping type of the second doped layer is the same as the doping type of the second semiconductor substrate, and a doping concentration of the second doped layer is higher than the doping concentration of the second semiconductor substrate.

Preferably, the first doped layer has a thickness of 1 μm to 10 μm, inclusive.

Preferably, the first doped layer has a doping concentration of $10^{12} \times cm^{-3}$ to $10^{13} \times cm^{-3}$, inclusive.

Preferably, in a case that the TI-IGBT is a punch-through TI-IGBT, the TI-IGBT further includes a buffer layer located between the first doped layer and the second semiconductor substrate, where a doping type of the buffer layer is the same as the doping type of the second semiconductor substrate and a doping concentration of the buffer layer is higher than the doping concentration of the second semiconductor substrate.

A formation method of a TI-IGBT includes: providing a first semiconductor substrate; forming a first doped layer on an upper surface of the first semiconductor substrate; forming a second semiconductor substrate above the first semiconductor substrate, where the second semiconductor substrate completely covers the first doped layer and the first semiconductor substrate; and forming a short-circuit region and a collector region disposed in parallel in the first semiconductor substrate, where the first doped layer covers at least the collector region, a doping type of the first doped layer is the same as a doping type of the second semiconductor substrate, and a doping concentration of the first doped layer is lower than a doping concentration of the second semiconductor substrate.

Preferably, the first doped layer completely covers the first semiconductor substrate.

Preferably, the first doped layer covers only the collector region.

Preferably, the formation method further includes forming a second doped layer on an upper surface of the short-circuit region before forming the second semiconductor substrate above the first semiconductor substrate, where a doping type of the second doped layer is the same as the doping type of the second semiconductor substrate, and a doping concentration of the second doped layer is higher than the doping concentration of the second semiconductor substrate.

Preferably, forming the short-circuit region and the collector region disposed in parallel in the first semiconductor substrate includes: thinning a lower surface of the first semiconductor substrate; forming the collector region by implanting P-type ions into a part of the first semiconductor substrate where the collector region is to be formed; and forming the short-circuit region by implanting N-type ions into a part of the first semiconductor substrate where the short-circuit region is to be formed.

Preferably, forming the short-circuit region and the collector region disposed in parallel in the first semiconductor substrate includes: thinning a lower surface of the first semiconductor substrate; forming the collector region by implanting P-type ions into the first semiconductor substrate; removing a part of the collector region in the first semiconductor region where the short-circuit region is to be formed; and forming the short-circuit region by implanting N-type ions into a part of the first semiconductor substrate where the short-circuit region is to be formed.

Preferably, the first semiconductor substrate is a P-type semiconductor substrate, and forming the short-circuit region and the collector region disposed in parallel in the first semiconductor substrate includes: thinning a lower surface of the first semiconductor substrate; and forming the short-circuit region by implanting N-type ions into a part of the first semiconductor substrate where the short-circuit region is to be formed, where a part of the first semiconductor substrate where the ions are not implanted is the collector region.

Preferably, the first semiconductor substrate is an N-type semiconductor substrate, and forming the short-circuit region and the collector region disposed in parallel in the first semiconductor substrate includes: thinning a lower surface of the first semiconductor substrate; forming the collector region by implanting P-type ions into a part of the first semiconductor substrate where the collector region is to be formed, where a part of the first semiconductor substrate where the ions are not implanted is the short-circuit region.

A formation method of a TI-IGBT includes: providing a first semiconductor substrate; forming a first doped layer on an upper surface of the first semiconductor substrate; forming a second semiconductor substrate above the first semiconductor substrate, where the second semiconductor substrate completely covers the first doped layer and the first semiconductor substrate; thinning a lower surface of the first semiconductor substrate to expose the first doped layer; and forming a short-circuit region and a collector region disposed in parallel in the first doped layer, where the first doped layer covers at least the collector region, a doping type of the first doped layer is the same as a doping type of the second semiconductor substrate, and a doping concentration of the first doped layer is lower than a doping concentration of the second semiconductor substrate.

Preferably, in a case that the TI-IGBT is a punch-through TI-IGBT, the formation method further includes forming a buffer layer above the first doped layer before forming the second semiconductor substrate above the first semiconductor substrate, where the buffer layer completely covers the first doped layer and the first semiconductor substrate, where a doping type of the buffer layer is the same as the doping type of the second semiconductor substrate, and a doping concentration of the buffer layer is higher than the doping concentration of the second semiconductor substrate.

Compared with the conventional technology, the above technical solutions have the following advantages.

In the TI-IGBT according to the embodiments of the present disclosure, a first doped layer between the first semiconductor substrate and the second semiconductor substrate is added, with the doping type of the first doped layer being the same as that of the second semiconductor substrate and the doping concentration of the first doped layer being lower than that of the second semiconductor substrate, and thus the resistance above the collector region in the first semiconductor substrate is increased. Therefore, compared with the TI-IGBT in the conventional technology, a voltage drop across the same distance above the collector region is increased under a certain current density in the TI-IGBT according to the present disclosure, such that the TI-IGBT enters into an IGBT mode at a smaller current, thereby solving the current snap-back phenomenon during the operation of the TI-IGBT in the conventional technology.

DETAILED DESCRIPTION

Figure 1:
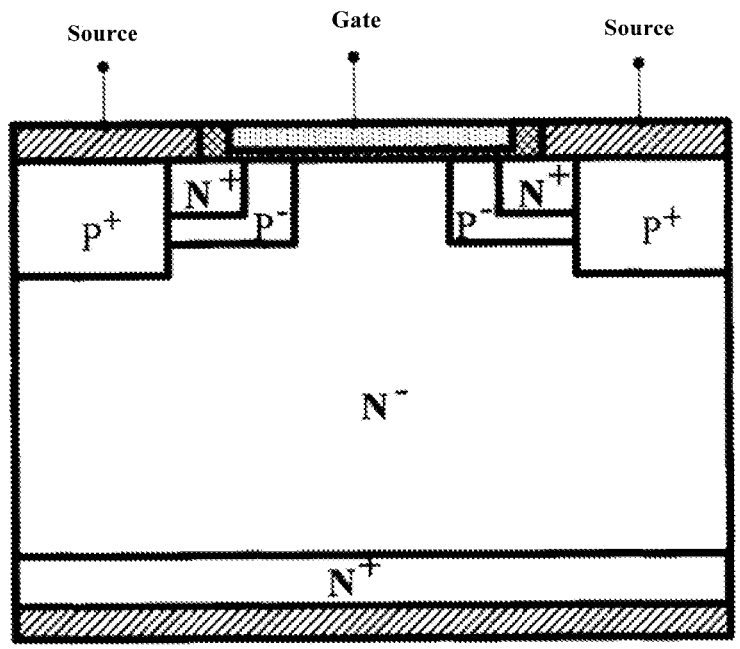
FIG. 1 is a schematic structural diagram of a VDMOS device in the conventional technology.
Figure 2:
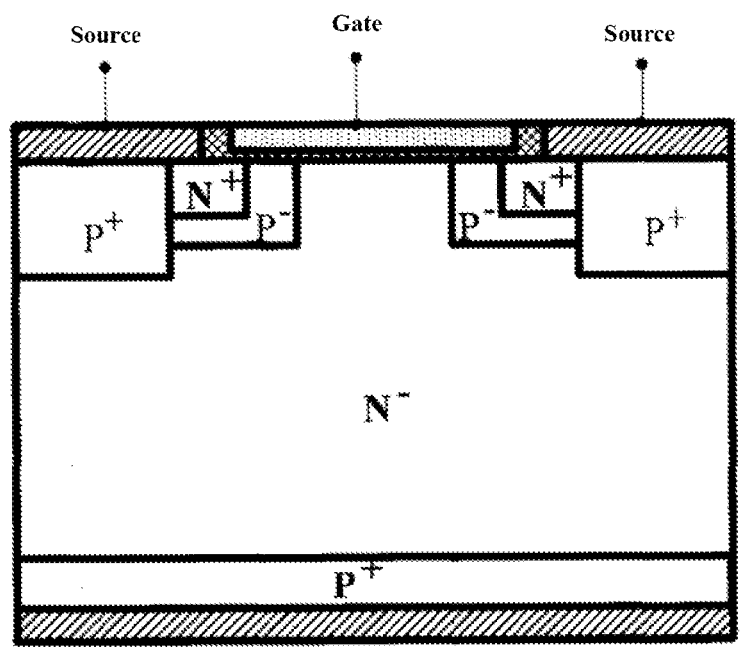
FIG. 2 is a schematic structural diagram of an IGBT device in the conventional technology.
Figure 3:
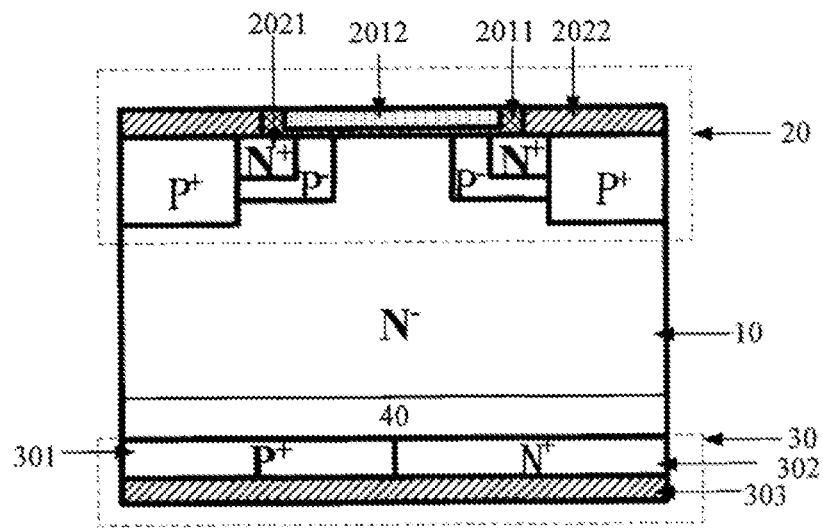
FIG. 3 is a schematic structural diagram of a TI-IGBT device in the conventional technology.

As shown in FIG. 3, the TI-IGBT device includes:

a semiconductor substrate, a front structure 20 formed on a front surface of the semiconductor substrate and a collector structure 30 formed on a rear surface of the semiconductor substrate. The part of the semiconductor substrate other than the parts of the front structure 20 and the collector structure 30 is a drift region 10.

The front structure 20 includes a gate structure 201 located on a surface of the semiconductor substrate and an emitter structure 202 located on both sides of the gate structure 201. The gate structure 201 includes a gate dielectric layer 2011 formed on the surface of the semiconductor substrate and a gate electrode layer 2012 located on a surface of the gate dielectric layer 2011. The emitter structure 202 includes an emitter 2021 formed on both sides of the gate structure 201 and in the semiconductor substrate and an emitter electrode 2022 formed on a surface of the emitter 2021 and electrically connected with the emitter 2021.

The collector structure 30 includes a collector region 301 and a short-circuit region 302 disposed in parallel on the rear surface of the semiconductor substrate and a collector 303 formed on the surfaces of the collector region 301 and the short-circuit region 302 and electrically connected with the collector region 301 and the short-circuit region 302.

In addition, in the case that the TI-IGBT device is a punch-through TI-IGBT device, the TI-IGBT device further includes a buffer layer 40 located between the collector structure 30 and the drift region 10. The doping type of the buffer layer 40 is the same as that of the drift region 10 and the doping concentration of the buffer layer 40 is higher than that of the drift region 10.

As described in the background, there is a current snapback phenomenon during the operation of the TI-IGBT device.

Figure 4:
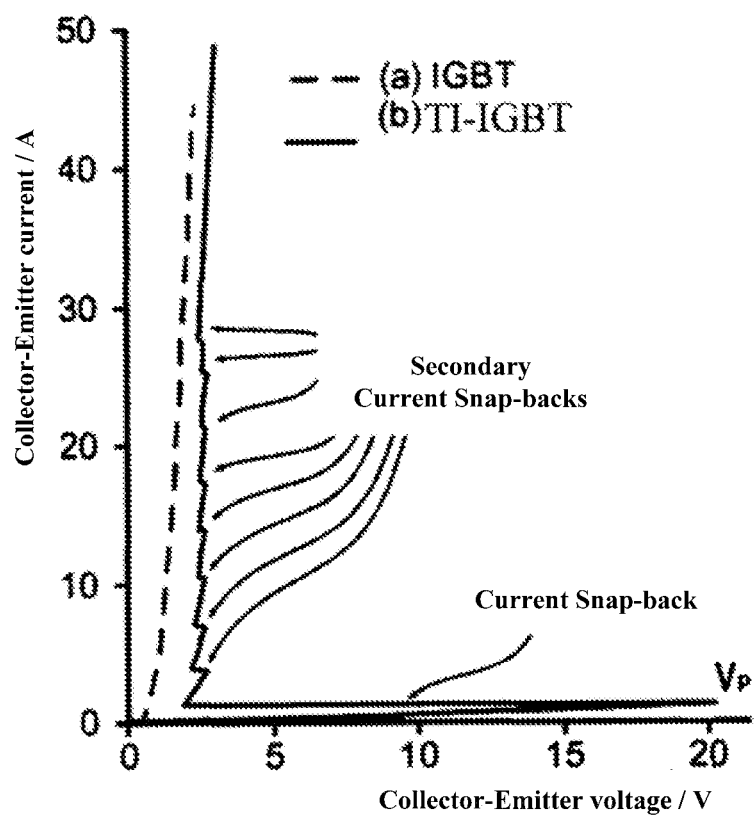
FIG. 4 is a schematic graph of an I-V characteristic curve of a TI-IGBT device in the conventional technology.

The inventor has found through research that, at the early stage of the conduction of the TI-IGBT device, the current of the TI-IGBT device is small and the voltage $V_{CE}$ between the gate structure 201 and the collector structure 30 is large, as shown in FIG. 4. In the case that the voltage $V_{CE}$ between the gate structure 201 and the collector structure 30 of the TI-IGBT device is larger than a specific value $V_p$, the voltage $V_{CE}$ between the gate structure 201 and the collector structure 30 rapidly decreases and the current rapidly increases, that is, a current snap-back phenomenon occurs.

Figure 5:
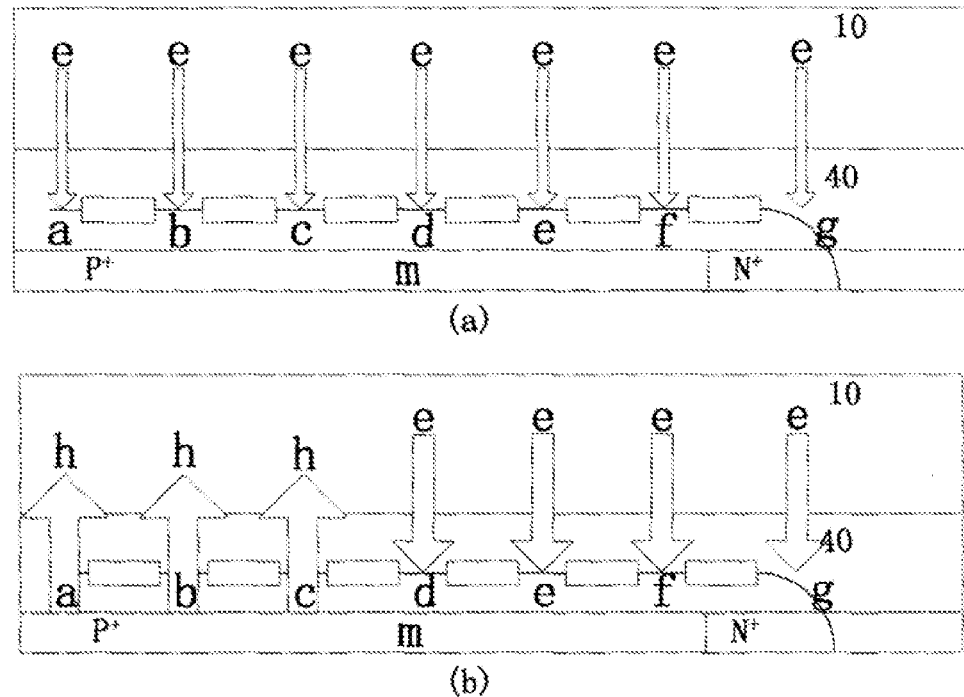
FIG. 5 is a schematic diagram of a principle of current snap-back of a TI-IGBT device in the conventional technology.

The inventor has further found through research that, in the case of a punch through TI-IGBT device, as shown in FIG. 5, at the early stage of the conduction, the TI-IGBT device operates in a VDMOS mode and is in unipolar conduction, electrons are injected into the drift region 10 from a channel region and then flow towards the buffer layer 40 in a nearly vertical direction; after the electrons are gathered together in the buffer layer 40, the electrons above the collector region 301 flow to the above of the short-circuit region 302 in a horizontal direction and then flow out of the collector structure 30 through the short-circuit region 302, and thus the electric potential above the collector region 301 gradually decreases in a direction from the edge of the collector region 301 to the center of the collector region 301.

Whether a collector junction of the punch-through TI-IGBT device is turned on depends on the electric potential above the collector region 301. At the early stage of the conduction of the punch-through TI-IGBT device, the current density is small. As shown in FIG. 5 (a), the electric potentials on both sides of the collector junction are smaller than a built-in electric potential of the collector junction, that is, Vmg<Vmf< . . . <Vma<0.7V, such that the voltage drop generated above the collector region 301 is not sufficient to turn on the collector junction, and thus no hole is injected into one side of the collector region 301. Accordingly, the conductivity modulation effect does not occur inside the punch-through TI-IGBT device, such that the conduction voltage drop of the punch-through TI-IGBT device is large, that is, the voltage $V_{CE}$ between the gate structure 201 and the collector structure 30 is large.

The current density and the forward bias voltage of the collector junction increase as the voltage applied between the gate structure 201 and the collector structure 30 increases, as shown in FIG. 5 (b), the collector junction starts to be turned on in the case that the voltage applied between the gate structure 201 and the collector structure 30 reaches a specific voltage value $V_p$. In the case that a portion of the collector junction is turned on, that is, Vmg< . . . <Vmd<0.7V<Vmc< . . . <Vma, holes starts to be injected into the conducted portion of the collector junction, and thus a conductivity modulation effect occurs inside the punch-through TI-IGBT device, and the conduction voltage drop of the punch-through TI-IGBT device significantly decreases.

In this case, the punch-through TI-IGBT device enters into an IGBT mode, and the conduction voltage drop of the punch-through TI-IGBT device is small, that is, the voltage $V_{CE}$ between the gate structure 201 and the collector structure 30 is small.

The inventor has further found through research that, the specific voltage value $V_p$ at which the current snap-back of the TI-IGBT device occurs may be significantly reduced by increasing the length $L_p$ of the collector region 301 in a direction from the collector region 301 to the short-circuit region 302, and thus the TI-IGBT device enters into the IGBT mode at a smaller current.

However, there is a range limit on the ratio of the length $L_p$ of the collector region 301 in a direction from the collector region 301 to the short-circuit region 302 to a length $L_N$ of the short-circuit region 302 in a direction from the collector region 301 to the short-circuit region 302. Therefore, as the length $L_p$ of the collector region 301 increases, the length $L_N$ of the short-circuit region 302 increases accordingly. The increase of the length $L_N$ of the short-circuit region 302, although has little influence on the specific voltage value $V_p$ at which the current snap-back of the TI-IGBT device occurs, will increase the current at which the current snap-back of the TI-IGBT device occurs. Therefore, it is not possible to simultaneously reduce the voltage and current at which the current snap-back of the TI-IGBT device occurs.

Moreover, the increase of the length $L_p$ of the collector region 301 results in a high current density above the collector region 301 and a low current density above the short-circuit region 302 in the case that the TI-IGBT is forward turned on, that is, the current distribution above the collector structure 30 is not uniform in a large scale, thereby reducing the power cycling ability of the TI-IGBT device.

On basis of the above research, a TI-IGBT and a formation method thereof are provided according to present disclosure. The TI-IGBT includes: a first semiconductor substrate, where a short-circuit region and a collector region disposed in parallel are formed in the first semiconductor substrate, and the doping type of the short-circuit region is different from that of the collector region; a second semiconductor substrate located above an upper surface of the first semiconductor substrate, where the doping type of the second semiconductor substrate is the same as that of the short-circuit region; and a first doped layer located between the first semiconductor substrate and the second semiconductor substrate, where the first doped layer covers at least the collector region in the first semiconductor substrate, the doping type of the first doped layer is the same as that of the second semiconductor substrate, and the doping concentration of the first doped layer is lower than that of the second semiconductor substrate. Therefore, the current snap-back phenomenon during the operation of the TI-IGBT device in the conventional technology is resolved without reducing the power cycling ability of the TI-IGBT device.

To make the above objects, features and advantages of the disclosure more apparent and easy to be understood, embodiments of the disclosure are illustrated in details below in conjunction with the drawings. The TI-IGBT according to the present disclosure is described by taking a non-punch-through planar gate TI-IGBT device as an example, but the TI-IGBT and the formation method thereof according to the present disclosure are also applicable to a punch-through planar gate TI-IGBT, a trench gate TI-IGBT device, or a reverse conducting IGBT of other types.

More specific details are set forth in the following descriptions for sufficient understanding of the disclosure.

However, the disclosure can also be implemented by other ways different from the way described herein, and similar extensions can be made by those skilled in the art without departing from the spirit of the disclosure. Therefore, the disclosure is not limited to the embodiments disclosed hereinafter.

Figure 6:
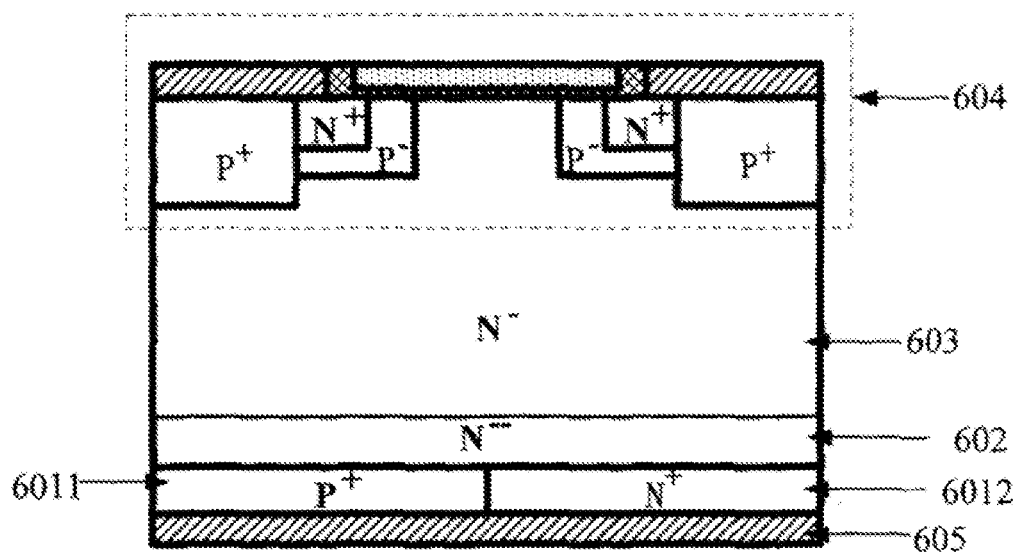
FIG. 6 is a schematic structural diagram of a TI-IGBT according to the present disclosure.

As shown in FIG. 6, the TI-IGBT according to an embodiment of the present disclosure includes: a first semiconductor substrate 601, where a collector region 6011 and a short-circuit region 6012 disposed in parallel are formed in the first semiconductor substrate 601; a second semiconductor substrate 603 located above an upper surface of the first semiconductor substrate 601; and a first doped layer 602 located between the first semiconductor substrate 601 and the second semiconductor substrate 603, and the first doped layer 602 covers at least the collector region 6011 in the first semiconductor substrate 601, where the doping type of the first doped layer 602 is the same as that of the second semiconductor substrate 603, and the doping concentration of the first doped layer 602 is lower than that of the second semiconductor substrate 603.

In addition, the TI-IGBT according to the embodiment of the present disclosure further includes a front structure 604 formed on a surface of the second semiconductor substrate 603. The front structure includes: a gate structure formed on the surface of the second semiconductor substrate 603, where the gate structure includes a gate dielectric layer formed on the surface of the second semiconductor substrate 603 and a gate electrode layer located on the surface of the gate dielectric layer; a base region formed on both sides of the gate structure and in the second semiconductor substrate 603 and a well region formed in the second semiconductor substrate 603 and located outside of the base region; and an emitter structure formed on both sides of the gate structure, where the emitter structure includes an emitter formed in the base region and an emitter electrode formed on the surfaces of the emitter region and the well region and electrically connected to the emitter region and the well region. The front structure of the second semiconductor substrate 603 is the same as that of the IGBT device in the conventional technology, which has been well known by those skilled in the art and thus is not described in detail in the embodiment of the present disclosure.

The conductive ability of the semiconductor is closely related to the doping concentration thereof. In the TI-IGBT according to the embodiment of the present disclosure, the doping concentration of the first doped layer 602 is lower than that of the second semiconductor substrate 603. Therefore, the conductive ability of the first doped layer 602 is lower than that of the second semiconductor substrate 603, that is, the resistivity of the first doped layer 602 is higher than that of the second semiconductor substrate 603. Therefore, at the early stage of the conduction of the TI-IGBT, the voltage drop across a unit distance above the collector region 6011 is increased in the case that electrons gathered together above the collector region 6011 flow to the above of the short-circuit region 6012, and thus the TI-IGBT enters into the IGBT mode at a smaller current, that is, the TI-IGBT enters into the conventional IGBT operation mode at a smaller current, to solve the current snap-back phenomenon occurred in the TI-IGBT in the conventional technology.

It can be seen from FIG. 6 that the first semiconductor substrate 601 is completely covered by the first doped layer 602 in the TI-IGBT according to an embodiment of the present disclosure.

Figure 7:
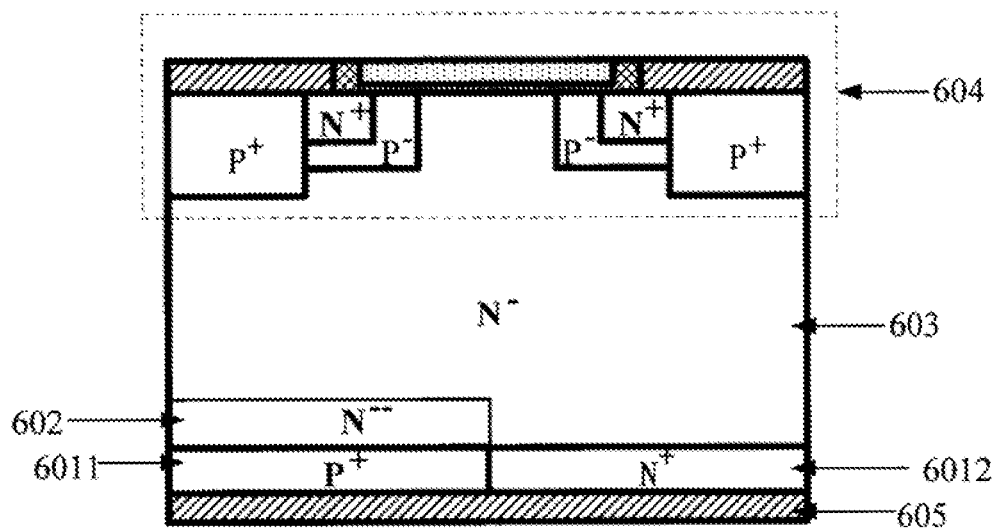
FIG. 7 is another schematic structural diagram of a TI-IGBT according to the present disclosure.

As shown in FIG. 7, in a TI-IGBT according to another embodiment of the present disclosure, only the collector region 6011 in the first semiconductor substrate 601 is covered by the first doped layer 602, which ensures the release rate of the electrons above the short-circuit region 6012 and increases the turn-off speed of the TI-IGBT while avoiding the current snap-back phenomenon during the operation of the TI-IGBT. Moreover, since the first doped layer 602 does not cover the short-circuit region 6012, the area of the first doped layer 602 is reduced, the number of the injected ions during the process of forming the first doped layer 602 is reduced and the fabrication cost of the TI-IGBT is reduced.

Figure 8:
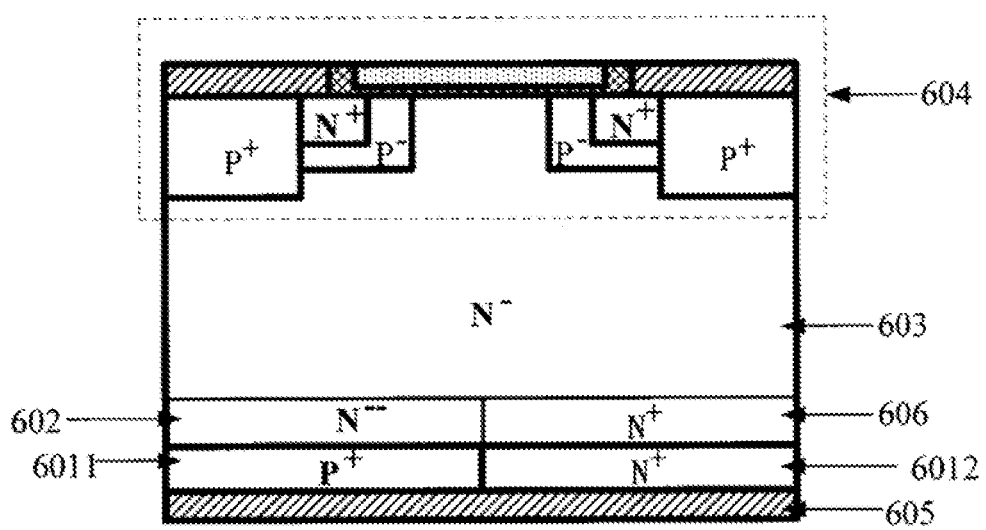
FIG. 8 is still another schematic structural diagram of a TI-IGBT according to the present disclosure.

As shown in FIG. 8, in a TI-IGBT according to still another embodiment of the present disclosure, only the collector region 6011 in the first semiconductor substrate 601 is covered by the first doped layer 602. The TI-IGBT further includes: a second doped layer 606 located between the second semiconductor substrate 603 and the short-circuit region 6012 in the first semiconductor substrate 601. The doping type of the second doped layer 606 is the same as that of the second semiconductor substrate 603, and the doping concentration of the second doped layer 606 is higher than that of the second semiconductor substrate 603. Therefore, the electric field in the drift region during the operation of the TI-IGBT can be rapidly stopped, and the conduction voltage drop of the TI-IGBT can be further reduced.

It should be noted that, in the TI-IGBT according to the present disclosure, the first semiconductor substrate 601 may be completely covered by the first doped layer 602, as shown in FIG. 6, or only the collector region 6011 in the first semiconductor substrate 601 is covered by the first doped layer 602, which is not limited in the present disclosure, as long as at least the collector region 6011 in the first semiconductor substrate 601 is covered by the first doped layer 602.

It should further be noted that, in the TI-IGBT according to an embodiment of the present disclosure, the first doped layer 602 preferably has a thickness of 1 μm to 10 μm, inclusive, and has a doping concentration of $10^{12} \times cm^{-3}$ to $10^{13} \times cm^{-3}$, inclusive, which are not limited in the present disclosure and can be determined based on the structure and the application of the TI-IGBT.

In the case that the TI-IGBT is a punch-through TI-IGBT, the TI-IGBT according to the present disclosure further includes a buffer layer located between the first doped layer 602 and the second semiconductor substrate 603. The doping type of the buffer layer is the same as that of the second semiconductor substrate 603 and the doping concentration of the buffer layer is higher than that of the second semiconductor substrate 603.

In summary, in the TI-IGBT according to the embodiments of the present disclosure, a first doped layer between the first semiconductor substrate and the second semiconductor substrate is added, with the doping type of the first doped layer being the same as that of the second semiconductor substrate and the doping concentration of the first doped layer being lower than that of the second semiconductor substrate, and thus the resistance above the collector region in the first semiconductor substrate is increased. Therefore, the TI-IGBT according to the present disclosure enters into the IGBT mode at a smaller current, thereby solving the current snap-back phenomenon during the operation of the TI-IGBT in the conventional technology.

A formation method of a TI-IGBT is further provided according to the disclosure. The method includes the following.

A first semiconductor substrate 601 is provided. The first semiconductor substrate may be an N-type silicon substrate or a P-type silicon substrate, which is not limited in the present disclosure.

Figure 9:
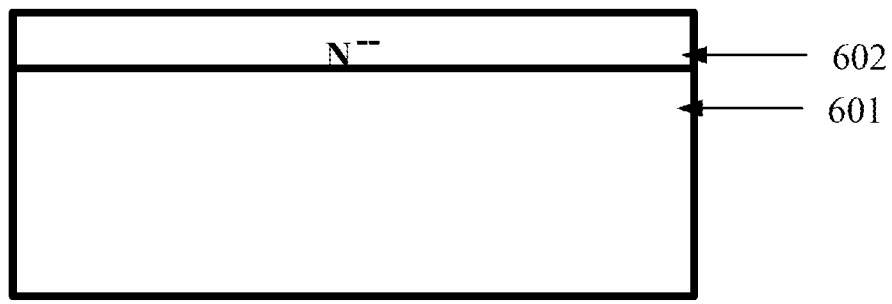
FIGS. 9-15 are diagrams related to the process of the formation of TI-IGBT.

A first doped layer 602 is formed on an upper surface of the first semiconductor substrate 601, as shown in FIG. 9. The process for forming the first doped layer 602 is preferably an epitaxial process.

A second semiconductor substrate 603 is formed above the first semiconductor substrate 601. The second semiconductor substrate 603 completely covers the first doped layer 602 and the first semiconductor substrate 601. The process for forming the second semiconductor substrate 603 is preferably an epitaxial process.

Figure 10:
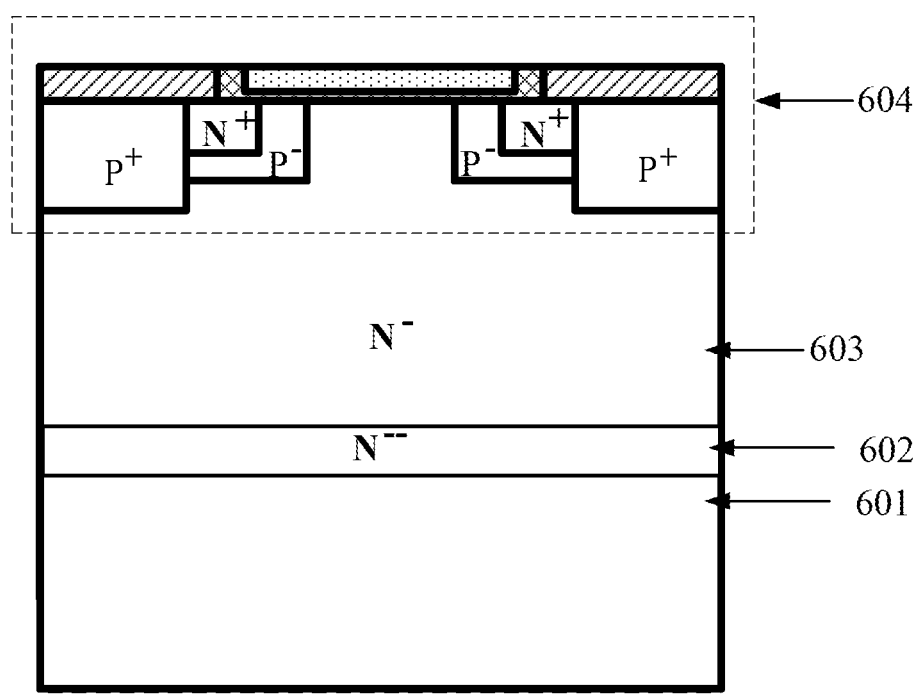

As shown in FIG. 10, a front structure is formed on an upper surface of the second semiconductor substrate 603. The front structure includes: a gate structure formed on a surface of the second semiconductor substrate 603, where the gate structure includes a gate dielectric layer formed on the surface of the second semiconductor substrate 603 and a gate electrode layer located on the surface of the gate dielectric layer; a base region formed on both sides of the gate structure and in the second semiconductor substrate 603 and a well region formed in the second semiconductor substrate 603 and located outside of the base region; and an emitter structure formed on both sides of the gate structure, where the emitter structure includes an emitter formed in the base region and an emitter electrode formed on the surfaces of the emitter region and the well region and electrically connected with the emitter region and the well region. The process for forming the front structure of the second semiconductor substrate 603 is well known by those skilled in the art and thus is not described in detail in the embodiment of the present disclosure.

Figure 11:
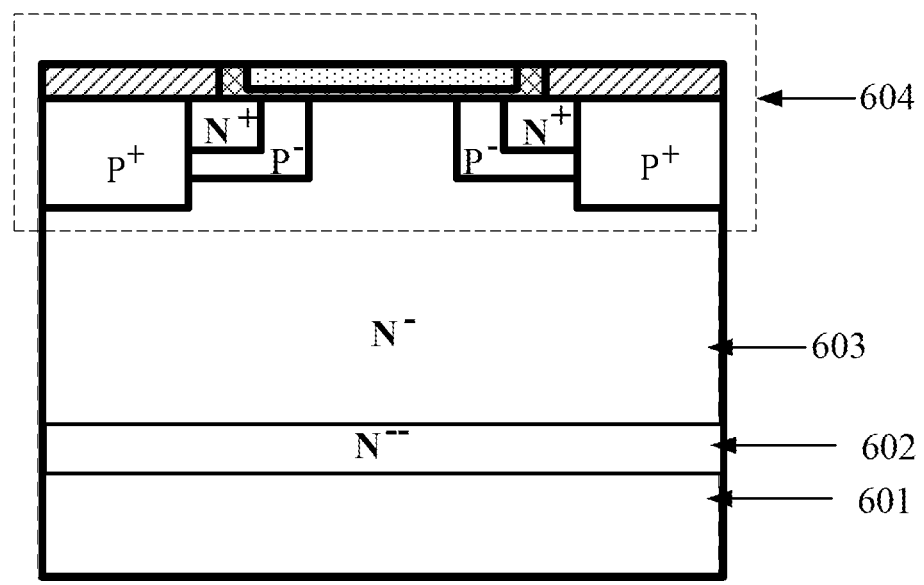

After the front structure of the second semiconductor substrate 603 is formed, the lower surface of the first semiconductor substrate 601 is thinned on the back, as shown in FIG. 11, and then a collector region 6011 and a short-circuit region 6012 disposed in parallel are formed in the first semiconductor substrate 601. The first doped layer 602 covers at least the collector region 6011 in the first semiconductor substrate 601, the doping type of the first doped layer 602 is the same as that of the second semiconductor substrate 603, and the doping concentration of the first doped layer 602 is lower than that of the second semiconductor substrate 603.

A collector 605 is formed on the surfaces of the collector region 6011 and the short-circuit region 6012. The collector 605 is electrically connected with the collector region 6011 and the short-circuit region 6012.

In the formation method of the TI-IGBT according to an embodiment of the present disclosure, in the case that the first semiconductor substrate 601 is a lightly doped semiconductor substrate, the process of thinning the lower surface of the first semiconductor substrate 601 on the back and then forming the collector region 6011 and the short-circuit region 6012 disposed in parallel in the first semiconductor substrate 601 includes:

thinning the lower surface of the first semiconductor substrate 601 and remaining the semiconductor substrate 601 with a certain thickness;

forming a first photoresist on the lower surface of the first semiconductor substrate 601, and forming a first window in the first photoresist, where the first window corresponds to a part of the first semiconductor substrate 601 where the collector region 6011 is to be formed;

implanting P-type ions into the first semiconductor substrate 601 by using the photoresist as a mask, to form the collector region 6011 in the first semiconductor substrate 601;

removing the first photoresist on the surface of the first semiconductor substrate 601, forming a second photoresist on the surface of the first semiconductor substrate 601, and then forming a second window in the second photoresist, where the second window corresponds to a part of the first semiconductor substrate 601 where the short-circuit region 6012 is to be formed; and implanting N-type ions into the part of the first semiconductor substrate 601 where the short-circuit region 6012 is to be formed by using the second photoresist as a mask, to form the short-circuit region 6012 in first semiconductor substrate 601.

Figure 12:
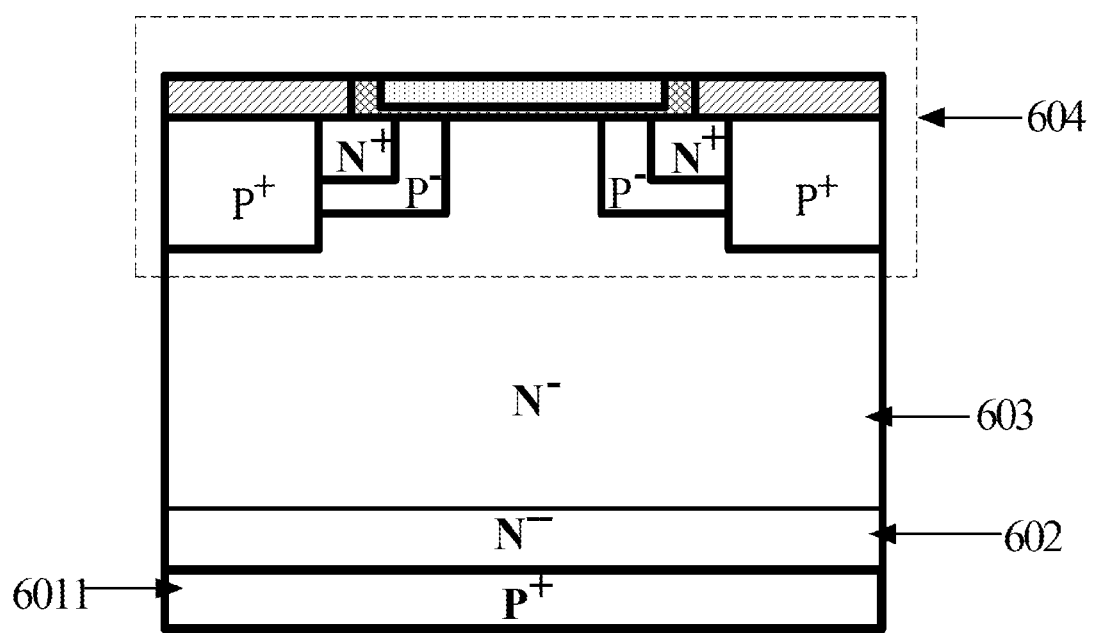
Figure 13:
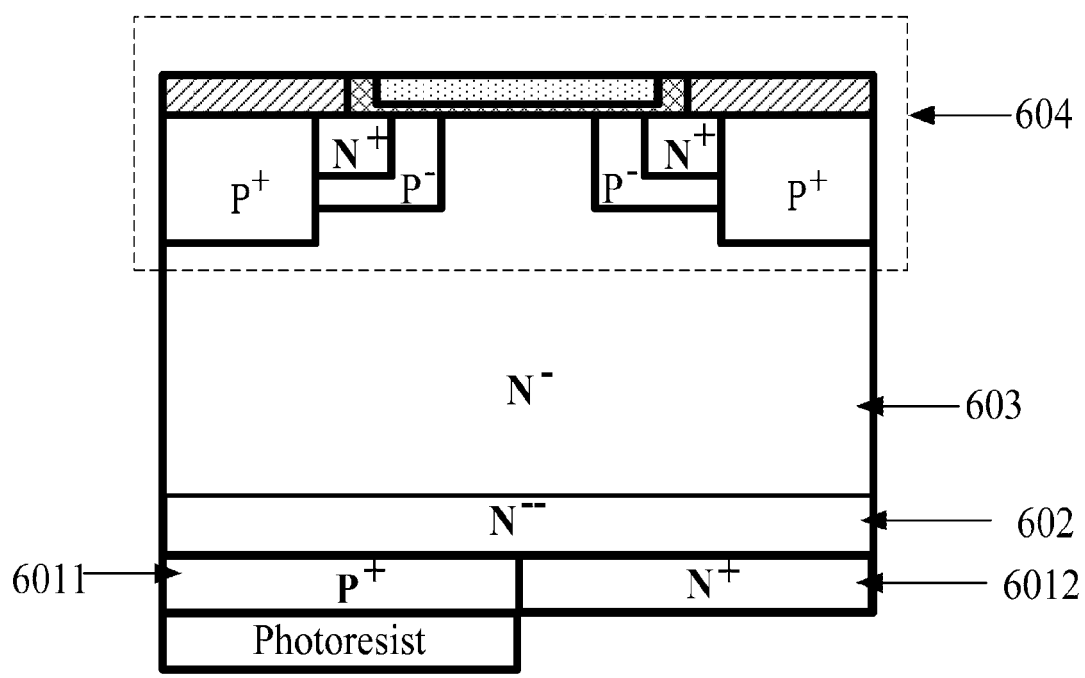

In the formation method of the TI-IGBT according to another embodiment of the present disclosure, in the case that the first semiconductor substrate 601 is a lightly doped semiconductor substrate, the process of thinning the lower surface of the first semiconductor substrate 601 on the back and then forming the collector region 6011 and the short-circuit region 6012 disposed in parallel in the first semiconductor substrate 601 includes:

thinning the lower surface of the first semiconductor substrate 601 and remaining the first semiconductor substrate 601 with a certain thickness;

implanting P-type ions into the first semiconductor substrate 601 to form the collector region 6011 in the first semiconductor substrate 601, as shown in FIG. 12;

removing a part of the collector region 6011 in the first semiconductor substrate 601 where the short-circuit region 6012 is to be formed;

forming a second photoresist on the surface of the first semiconductor substrate 601, and then forming a second window in the second photoresist, where the second window corresponds to a part of the first semiconductor substrate 601 where the short-circuit region 6012 is to be formed; and implanting N-type ions into the part of the first semiconductor substrate 601 where the short-circuit region 6012 is to be formed by using the second photoresist as a mask, to form the short-circuit region 6012 in first semiconductor substrate 601, as shown in FIG. 13.

In the case that the first semiconductor substrate 601 is a P-type semiconductor substrate, the process of thinning the lower surface of the first semiconductor substrate 601 on the back and then forming the collector region 6011 and the short-circuit region 6012 disposed in parallel in the first semiconductor substrate 601 includes:

thinning the lower surface of the first semiconductor substrate 601;

forming a photoresist on the surface of the first semiconductor substrate 601 and forming an etched window on the photoresist, where the etched window corresponds to a part of the first semiconductor substrate 601 where the short-circuit region 6012 is to be formed; and implanting N-type ions into the part of the first semiconductor substrate 601 where the short-circuit region 6012 is to be formed by using the photoresist as a mask, to form the short-circuit region 6012 in first semiconductor substrate 601, where a part of the first semiconductor substrate 601 where the ions are not implanted is the collector region 6011.

In the case that the first semiconductor substrate 601 is an N-type semiconductor substrate, the process of thinning the lower surface of the first semiconductor substrate 601 on the back and then forming the collector region 6011 and the short-circuit region 6012 disposed in parallel in the first semiconductor substrate 601 includes:

thinning the lower surface of the first semiconductor substrate 601;

forming a photoresist on the surface of the first semiconductor substrate 601 and forming an etched window on the photoresist, where the etched window corresponds to a part of the first semiconductor substrate 601 where the collector region 6011 is to be formed;

implanting P-type ions into a part of the first semiconductor substrate 601 where the collector region 6011 is to be formed by using the photoresist as a mask, to form the collector region 6011 in first semiconductor substrate 601, where a part of the first semiconductor substrate 601 where the ions are not implanted is the short-circuit region 6012.

Another formation method of a TI-IGBT is further provided according to the disclosure. The method includes the following.

A first semiconductor substrate 601 is provided. The first semiconductor substrate may be an N-type silicon substrate or a P-type silicon substrate, which is not limited in the present disclosure.

A first doped layer 602 is formed on an upper surface of the first semiconductor substrate 601.

A second semiconductor substrate 603 is formed above the first semiconductor substrate 601. The second semiconductor substrate 603 completely covers the first doped layer 602 and the first semiconductor substrate 601.

A front structure is formed on an upper surface of the second semiconductor substrate 603.

A lower surface of the first semiconductor substrate 601 is thinned on the back to expose the first doped layer 602 after the front structure of the second semiconductor substrate 603 is formed.

A collector region and a short-circuit region disposed in parallel is formed in the first doped layer 602.

A collector 605 is formed on the surfaces of the collector region 6011 and the short-circuit region 6012. The collector 605 is electrically connected with the collector region 6011 and the short-circuit region 6012.

It should be noted that, the depths of the collector region and the short-circuit region should be strictly controlled in the case that the short-circuit region and the collector region are formed in the first doped layer 602, so that the region of the first doped layer 602 where the collector region is not formed covers at least the collector region.

In the formation method of the TI-IGBT according to the embodiments of the present disclosure, the first doped layer 602 may completely cover the first semiconductor substrate 601, or may cover only the collector region 6011 in the first semiconductor substrate 601, which is not limited in the present disclosure, as long as the first doped layer 602 covers at least the collector region 6011 in the first semiconductor substrate 601.

Figure 14:
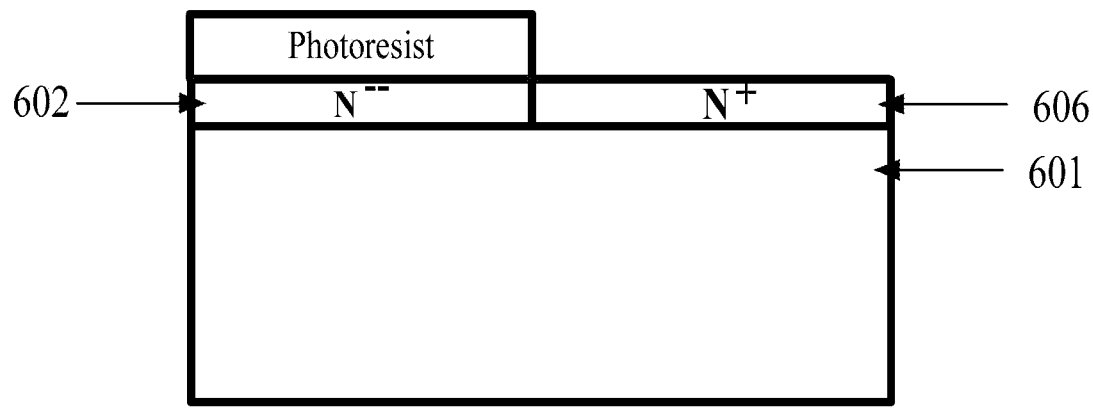

In the case that the first doped layer 602 covers only the collector region 6011 in the first semiconductor substrate 601 in the formation method of the TI-IGBT according to the embodiment of the present disclosure, the formation method of the TI-IGBT according to the embodiment of the present disclosure may further include forming a second doped layer 606 on an upper surface of the short-circuit region 6012 before forming the second semiconductor substrate 602 above the first semiconductor substrate 601, as shown in FIG. 14. The doping type of the second doped layer 606 is the same as that of the second semiconductor substrate 603, and the doping concentration of the second doped layer 606 is higher than that of the second semiconductor substrate 603. Therefore, the electric field in the drift region during the operation of the TI-IGBT can be rapidly stopped, and the conduction voltage drop of the TI-IGBT can be further reduced.

Figure 15:
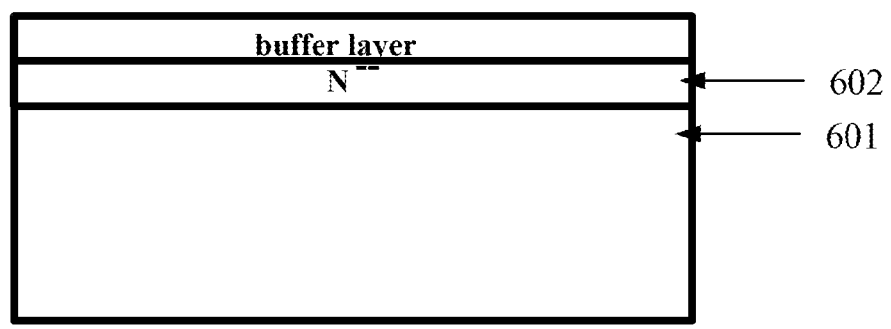

It should be noted that, in the case that the TI-IGBT is a punch-through TI-IGBT in the formation method of the TI-IGBT according to the present disclosure, the formation method further includes forming a buffer layer above the first doped layer 602 before forming the second semiconductor substrate 603 above the first semiconductor substrate 601, as shown in FIG. 15. The buffer layer completely covers first doped layer 602 and the first semiconductor substrate 601. The doping type of the buffer layer is the same as that of the second semiconductor substrate 603, and the doping concentration of the buffer layer is higher than that of the second semiconductor substrate 603.

In summary, in the formation method of the TI-IGBT according to the embodiments of the present disclosure, a first doped layer between the first semiconductor substrate and the second semiconductor substrate is added, with the doping type of the first doped layer being the same as that of the second semiconductor substrate and the doping concentration of the first doped layer being lower than that of the second semiconductor substrate, and thus the resistance above the collector region in the first semiconductor substrate is increased. Therefore, the TI-IGBT according to the present disclosure enters into the IGBT mode at a smaller current, thereby solving the current snap-back phenomenon during the operation of the TI-IGBT in the conventional technology.

The various parts of the present disclosure are described herein in a progressive manner, with the emphasis of each of the parts placed on the difference between it and the other parts. For the same or similar content between the various parts, one can refer to the other parts.

The above description of the disclosed embodiments enables those skilled in the art to implement or use the present disclosure. Numerous modifications to the embodiments will be apparent to those skilled in the art, and the general principle herein can be implemented in other embodiments without deviation from the spirit or scope of the present disclosure. Therefore, the present disclosure is not limited to the embodiments described herein, but in accordance with the widest scope consistent with the principle and novel features disclosed herein.

The invention claimed is:

1. A formation method of a TI-IGBT, comprising:
  providing a first semiconductor substrate;
  forming a first doped layer on an upper surface of the first semiconductor substrate;
  forming a second semiconductor substrate above the first semiconductor substrate, wherein the second semiconductor substrate completely covers the first doped layer and the first semiconductor substrate; and
  forming a short-circuit region and a collector region disposed in parallel in the first semiconductor substrate, wherein the first doped layer covers at least the collector region, a doping type of the first doped layer is the same as a doping type of the second semiconductor substrate, and a doping concentration of the first doped layer is lower than a doping concentration of the second semiconductor substrate,
  wherein forming the short-circuit region and the collector region disposed in parallel in the first semiconductor substrate comprises:
  thinning a lower surface of the first semiconductor substrate;

forming the collector region by implanting P-type ions into the first semiconductor substrate;

removing a part of the collector region in the first semiconductor region where the short-circuit region is to be formed; and forming the short-circuit region by implanting N-type ions into a part of the first semiconductor substrate where the short-circuit region is to be formed.

2. The formation method according to claim 1, wherein the TI-IGBT is a punch-through TI-IGBT and the method further comprises: forming a buffer layer above the first doped layer before forming the second semiconductor substrate above the first semiconductor substrate, wherein the buffer layer completely covers the first doped layer and the first semiconductor substrate, wherein a doping type of the buffer layer is the same as the doping type of the second semiconductor substrate, and a doping concentration of the buffer layer is higher than the doping concentration of the second semiconductor substrate.

3. The formation method according to claim 1, wherein the first doped layer completely covers the first semiconductor substrate.

4. The formation method according to claim 3, wherein the TI-IGBT is a punch-through TI-IGBT and the method further comprises: forming a buffer layer above the first doped layer before forming the second semiconductor substrate above the first semiconductor substrate, wherein the buffer layer completely covers the first doped layer and the first semiconductor substrate, wherein a doping type of the buffer layer is the same as the doping type of the second semiconductor substrate, and a doping concentration of the buffer layer is higher than the doping concentration of the second semiconductor substrate.

5. The formation method according to claim 1, wherein the first doped layer covers only the collector region.

6. The formation method according to claim 5, wherein the TI-IGBT is a punch-through TI-IGBT and the method further comprises: forming a buffer layer above the first doped layer before forming the second semiconductor substrate above the first semiconductor substrate, wherein the buffer layer completely covers the first doped layer and the first semiconductor substrate, wherein a doping type of the buffer layer is the same as the doping type of the second semiconductor substrate, and a doping concentration of the buffer layer is higher than the doping concentration of the second semiconductor substrate.

7. The formation method according to claim 5, further comprising: forming a second doped layer on an upper surface of the short-circuit region before forming the second semiconductor substrate above the first semiconductor substrate, wherein a doping type of the second doped layer is the same as the doping type of the second semiconductor substrate, and a doping concentration of the second doped layer is higher than the doping concentration of the second semiconductor substrate.

8. A formation method of a TI-IGBT, comprising:

providing a first semiconductor substrate;

forming a first doped layer on an upper surface of the first semiconductor substrate;

forming a second semiconductor substrate above the first semiconductor substrate, wherein the second semiconductor substrate completely covers the first doped layer and the first semiconductor substrate;

thinning a lower surface of the first semiconductor substrate to expose the first doped layer; and forming a short-circuit region and a collector region disposed in parallel in the first doped layer, wherein the first doped layer covers at least the collector region, a doping type of the first doped layer is the same as a doping type of the second semiconductor substrate, and a doping concentration of the first doped layer is lower than a doping concentration of the second semiconductor substrate.

9. The formation method according to claim 8, wherein the TI-IGBT is a punch-through TI-IGBT and the method further comprises: forming a buffer layer above the first doped layer before forming the second semiconductor substrate above the first semiconductor substrate, wherein the buffer layer completely covers the first doped layer and the first semiconductor substrate, wherein a doping type of the buffer layer is the same as the doping type of the second semiconductor substrate, and a doping concentration of the buffer layer is higher than the doping concentration of the second semiconductor substrate.

* * * * *